(12) United States Patent
Koo et al.

(10) Patent No.: US 7,250,741 B2
(45) Date of Patent: Jul. 31, 2007

(54) METHOD AND SYSTEM FOR CALCULATING AVAILABLE POWER OF A BATTERY

(75) Inventors: Jae Seung Koo, Hwaseong (KR); Suk Hyung Kim, Hwaseong (KR)

(73) Assignee: Hyundai Motor Company, Seocho-Ku, Seoul (KR)

( * ) Notice: Subject to any disclaimer, the term of this patent is extended or adjusted under 35 U.S.C. 154(b) by 365 days.

(21) Appl. No.: 10/826,178

(22) Filed: Apr. 16, 2004

(65) Prior Publication Data

US 2005/0035742 A1    Feb. 17, 2005

(30) Foreign Application Priority Data

Aug. 13, 2003  (KR)  ........................ 10-2003-0056187
Dec. 2, 2003    (KR)  ........................ 10-2003-0086648

(51) Int. Cl.
*H01M 10/46*    (2006.01)
(52) U.S. Cl. ..................................................... 320/132
(58) Field of Classification Search ................ 320/132, 320/149; 324/429, 430, 431, 433
See application file for complete search history.

(56) References Cited

U.S. PATENT DOCUMENTS 5,381,096 A * 1/1995 Hirzel ........................ 324/427
5,625,272 A   4/1997 Takahashi
5,633,573 A   5/1997 Van Phuoc et al.
5,905,362 A * 5/1999 Nagano et al. ............. 320/125
2004/0130297 A1* 7/2004 Baeuerlein et al. ......... 320/137

FOREIGN PATENT DOCUMENTS

DE   103 48 031 A1   4/2004
JP   10-104325       4/1998

* cited by examiner

*Primary Examiner*—Edward H. Tso
(74) *Attorney, Agent, or Firm*—Morgan Lewis & Bockius LLP

(57) ABSTRACT

A method for calculating available power of a battery includes steps of calculating an equivalent charge resistance at a current charge current, a current SOC (state of charge), and a current battery temperature using predetermined equivalent charge resistance data, calculating an effective no-load charge voltage at the current charge current, the current SOC, and the current battery temperature using predetermined effective no-load charge voltage data, calculating a maximum charge current based on the equivalent charge resistance, the effective no-load charge voltage, and a predetermined maximum charge voltage, and calculating available charge power based on the maximum charge current, the predetermined maximum charge voltage, and a predetermined battery maximum current. A system for executing the method is also disclosed.

40 Claims, 7 Drawing Sheets

METHOD AND SYSTEM FOR CALCULATING AVAILABLE POWER OF A BATTERY

CROSS REFERENCE TO RELATED APPLICATIONS

This application claims priority to Korean Application Nos. 10-2003-0056187, filed on Aug. 13, 2003, and 10-2003-0086648, filed on Dec. 2, 2003, the disclosures of which are incorporated fully here by reference.

FIELD OF THE INVENTION

The present invention relates to a method and system for calculating available power of a battery.

BACKGROUND OF THE INVENTION

Generally, in order to use a battery as a power source, it is necessary to be aware of available power of the battery under a specific condition. In particular, in a hybrid electric vehicle that uses the battery as one of its power sources, it is important to exactly predict a maximum available power of the battery. However, the available power of the battery changes according to a state of charge (SOC), a battery temperature, and aging of the battery. Therefore, it is difficult to exactly know the available power of the battery.

A battery control unit for a hybrid electric vehicle generally determines available charge power and available discharge power in real time, and sends the determined available power information to a hybrid electric vehicle control unit (HCU), in order to maximally use the battery. In the past, the available battery power has generally been calculated using a condition of maximum electric power transmission. As an example, in a steady state, battery power can be calculated by the following equation.

$$P_{max} = R_e I_t^2 = R_e \times \left(\frac{V_{oc}}{r + R_e}\right)^2 \quad \text{[Equation]}$$

where $R_e$ is an equivalent resistance of a battery, $V_{oc}$ is an effective no-load voltage of the battery, and r is a resistance of a load.

In the above equation, if the equivalent resistance of the battery is equal to the resistance of the battery (i.e., $r=R_e$), a maximum power (i.e., $P_{max}=V_{oc}^2/4R_e$) is transmitted to the load. That is, a maximum power can be used when the equivalent resistance of the battery is equal to the resistance of the battery from the condition of the maximum power transmission. However, in the above method to calculate the maximum available power, battery operating voltage is not considered, and the resistance of the load must be known to calculate the maximum power. Therefore, it is quite difficult to use such a method for a hybrid electric vehicle.

The information disclosed in this Background of the Invention section is only for enhancement of understanding of the background of the invention and should not be taken as an acknowledgement or any form of suggestion that this information forms the prior art that is already known to a person skilled in the art.

SUMMARY OF THE INVENTION

Embodiments of the present invention provide methods and systems that can calculate available power of a battery on the basis of battery conditions.

In a preferred embodiment of the present invention, the method for calculating available power of a battery comprises:

calculating an equivalent charge resistance at a current charge current, a current SOC (state of charge), and a current battery temperature using predetermined equivalent charge resistance data;

calculating an effective no-load charge voltage at the current charge current, the current SOC, and the current battery temperature using predetermined effective no-load charge voltage data;

calculating a maximum charge current based on the equivalent charge resistance, the effective no-load charge voltage, and a predetermined maximum charge voltage; and calculating available charge power based on the maximum charge current, the predetermined maximum charge voltage, and a predetermined battery maximum current.

It is preferable that the maximum charge current is calculated by dividing a difference between the predetermined maximum charge voltage and the effective no-load charge voltage by the equivalent charge resistance.

Preferably, in calculating available charge power, the available charge power is calculated by multiplying the predetermined maximum charge voltage by the predetermined battery maximum current if the maximum charge current is greater than the predetermined battery maximum current, and the available charge power is calculated by multiplying the predetermined maximum charge voltage by the maximum charge current if the maximum charge current is not greater than the predetermined battery maximum current.

Preferably, the method further comprises renewing a charge voltage feedback factor based on the current battery voltage and the predetermined maximum charge voltage, and in calculating available charge power, the available charge power is based on the maximum charge current, the predetermined maximum charge voltage, the predetermined battery maximum current, and the charge voltage feedback factor.

Further preferably, in calculating available charge power, the available charge power is calculated through a multiplication of the predetermined maximum charge voltage, the predetermined battery maximum current, and the charge voltage feedback factor if the maximum charge current is greater than the predetermined battery maximum current, and the available charge power is calculated through a multiplication of the predetermined maximum charge voltage, the maximum charge current, and the charge voltage feedback factor if the maximum charge current is not greater than the predetermined battery maximum current.

It is preferable that in renewing a charge voltage feedback factor, the charge voltage feedback factor is decreased by a first predetermined value if the current battery voltage is greater than the predetermined maximum charge voltage, and the charge voltage feedback factor is increased by a second predetermined value if the current battery voltage is not greater than the predetermined maximum charge voltage.

It is further preferable that in renewing a charge voltage feedback factor, the charge voltage feedback factor is set as 1 if the changed charge voltage feedback factor is greater than 1, and the charge voltage feedback factor is set as 0 if the changed charge voltage feedback factor is less than 0.

It is preferable that the equivalent charge resistance data include a plurality of equivalent charge resistances respectively at predetermined charge current ranges, predetermined SOCs, and predetermined battery temperatures.

It is further preferable that the equivalent charge resistance at the current charge current, the current SOC, and the current battery temperature are calculated through interpolation using the equivalent charge resistance data.

It is preferable that the effective no-load charge voltage data include a plurality of effective no-load charge voltages respectively at predetermined charge current ranges, predetermined SOCs, and predetermined battery temperatures.

It is further preferable that the effective no-load charge voltage at the current charge current, the current SOC, and the current battery temperature are calculated through interpolation using the effective no-load charge voltage data.

In another embodiment of the present invention, the method for calculating available power of a battery comprising:
  calculating an equivalent discharge resistance at a current discharge current, a current SOC (state of charge), and a current battery temperature using predetermined equivalent discharge resistance data;
  calculating an effective no-load discharge voltage at the current discharge current, the current SOC, and the current battery temperature using predetermined effective no-load discharge voltage data;
  calculating a maximum discharge current based on the equivalent discharge resistance, the effective no-load discharge voltage, and a predetermined minimum discharge voltage;
  calculating a discharge terminal voltage based on the maximum discharge current, the effective no-load discharge voltage, the equivalent discharge resistance, and a predetermined battery maximum current; and
  calculating available discharge power based on the maximum discharge current and the discharge terminal voltage.

It is preferable that the maximum discharge current is calculated by dividing a difference between the effective no-load discharge voltage and the predetermined minimum discharge voltage by the equivalent discharge resistance.

It is also preferable that in calculating a discharge terminal voltage, the discharge terminal voltage is calculated as a difference between the effective no-load discharge voltage and a multiplication of the predetermined battery maximum current and the equivalent discharge resistance if the maximum discharge current is greater than the predetermined battery maximum current, and the discharge terminal voltage is calculated as a difference between the effective no-load discharge voltage and a multiplication of the maximum discharge current and the equivalent discharge resistance if the maximum discharge current is not greater than the predetermined battery maximum current.

It is further preferable that in calculating available discharge power, the available discharge power is calculated through a multiplication of the discharge terminal voltage and the maximum discharge current.

Preferably, the method further comprises renewing a discharge voltage feedback factor based on the current battery voltage and the predetermined minimum discharge voltage, and in calculating available discharge power, the available discharge power is calculated based on the maximum discharge current, the discharge terminal voltage, and the discharge voltage feedback factor.

Further preferably, in calculating a discharge terminal voltage, the discharge terminal voltage is calculated as a difference between the effective no-load discharge voltage and a multiplication of the predetermined battery maximum current and the equivalent discharge resistance if the maximum discharge current is greater than the predetermined battery maximum current, and the discharge terminal voltage is calculated as a difference between the effective no-load discharge voltage and a multiplication of the maximum discharge current and the equivalent discharge resistance if the maximum discharge current is not greater than the predetermined battery maximum current.

Still further preferably, in calculating available discharge power, the available discharge power is calculated through a multiplication of the discharge terminal voltage, the maximum discharge current, and the discharge voltage feedback factor.

It is preferable that in renewing a discharge voltage feedback factor, the discharge voltage feedback factor is decreased by a first predetermined value if the current battery voltage is less than the predetermined minimum discharge voltage, and the discharge voltage feedback factor is increased by a second predetermined value if the current battery voltage is not less than the predetermined minimum discharge voltage.

Preferably, in renewing a discharge voltage feedback factor, the discharge voltage feedback factor is set as 1 if the changed discharge voltage feedback factor is greater than 1, and the discharge voltage feedback factor is set as 0 if the changed discharge voltage feedback factor is less than 0.

It is preferable that the equivalent discharge resistance data include a plurality of equivalent discharge resistances respectively at predetermined discharge current ranges, predetermined SOCs, and predetermined battery temperatures.

It is further preferable that the equivalent discharge resistance at the current discharge current, the current SOC, and the current battery temperature are calculated through interpolation using the equivalent discharge resistance data.

It is also preferable that the effective no-load discharge voltage data include a plurality of effective no-load discharge voltages respectively at predetermined discharge current ranges, predetermined SOCs, and predetermined battery temperatures.

It is further preferable that the effective no-load discharge voltage at the current discharge current, the current SOC, and the current battery temperature are calculated through interpolation using the effective no-load discharge voltage data.

In an embodiment of the present invention, the system for calculating available power of a battery comprises a battery temperature sensor, a battery current sensor, a battery voltage sensor, and a battery control unit. The battery temperature sensor detects a temperature of the battery and outputs a corresponding signal. The battery current sensor detects a current of the battery and outputs a corresponding signal. The battery voltage sensor detects a voltage of the battery and outputs a corresponding signal. The battery control unit receives signals from the battery temperature sensor, the battery current sensor, and the battery voltage sensor. The battery control unit is programmed to perform one of the above methods.

BRIEF DESCRIPTION OF THE DRAWINGS

The accompanying drawings, which are incorporated in and constitute a part of the specification, illustrate an embodiment of the invention, and together with the description, serve to explain the principles of the invention, where.

DETAILED DESCRIPTION OF THE PREFERRED EMBODIMENTS

Hereinafter, embodiments of the present invention will be described in detail with reference to the accompanying drawings.

Figure 1:
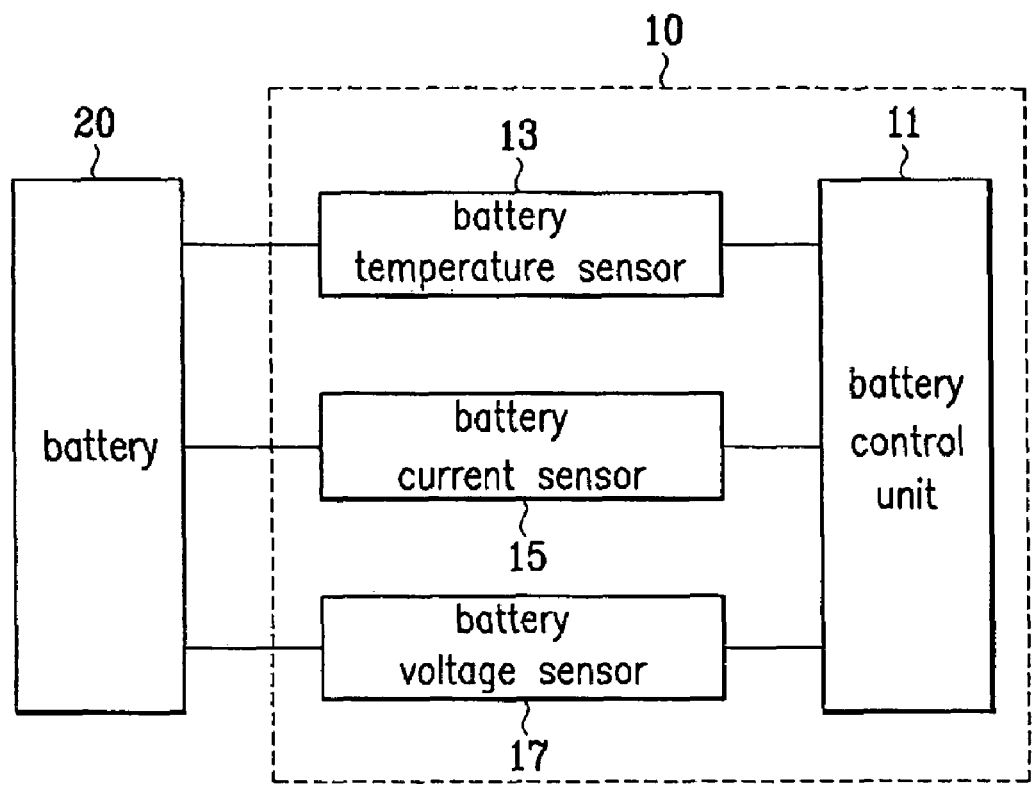
FIG. 1 is a block diagram of a system for calculating available power of a battery according to an embodiment of the present invention.

As shown in FIG. 1, a system 10 for calculating available power of a battery 20 according to an embodiment of the present invention comprises a battery control unit 11, a battery temperature sensor 13, a battery current sensor 15, and a battery voltage sensor 17. The battery temperature sensor 13 detects the temperature of the battery 20 and outputs a corresponding signal. The battery current sensor 15 detects the current (a charge current or a discharge current) of the battery 20 and outputs a corresponding signal. The battery voltage sensor 17 detects the voltage of the battery 20 and outputs a corresponding signal. The battery control unit 11 receives the signals indicating the battery temperature, the battery current, and the battery voltage from the battery temperature sensor 13, the battery current sensor 15, and the battery voltage sensor 17.

The battery control unit 11 preferably includes a processor, a memory, and other necessary hardware and software components as will be understood by persons skilled in the art, to permit the control unit to 11 communicate with sensors and execute the control logic as described herein.

Figure 2:
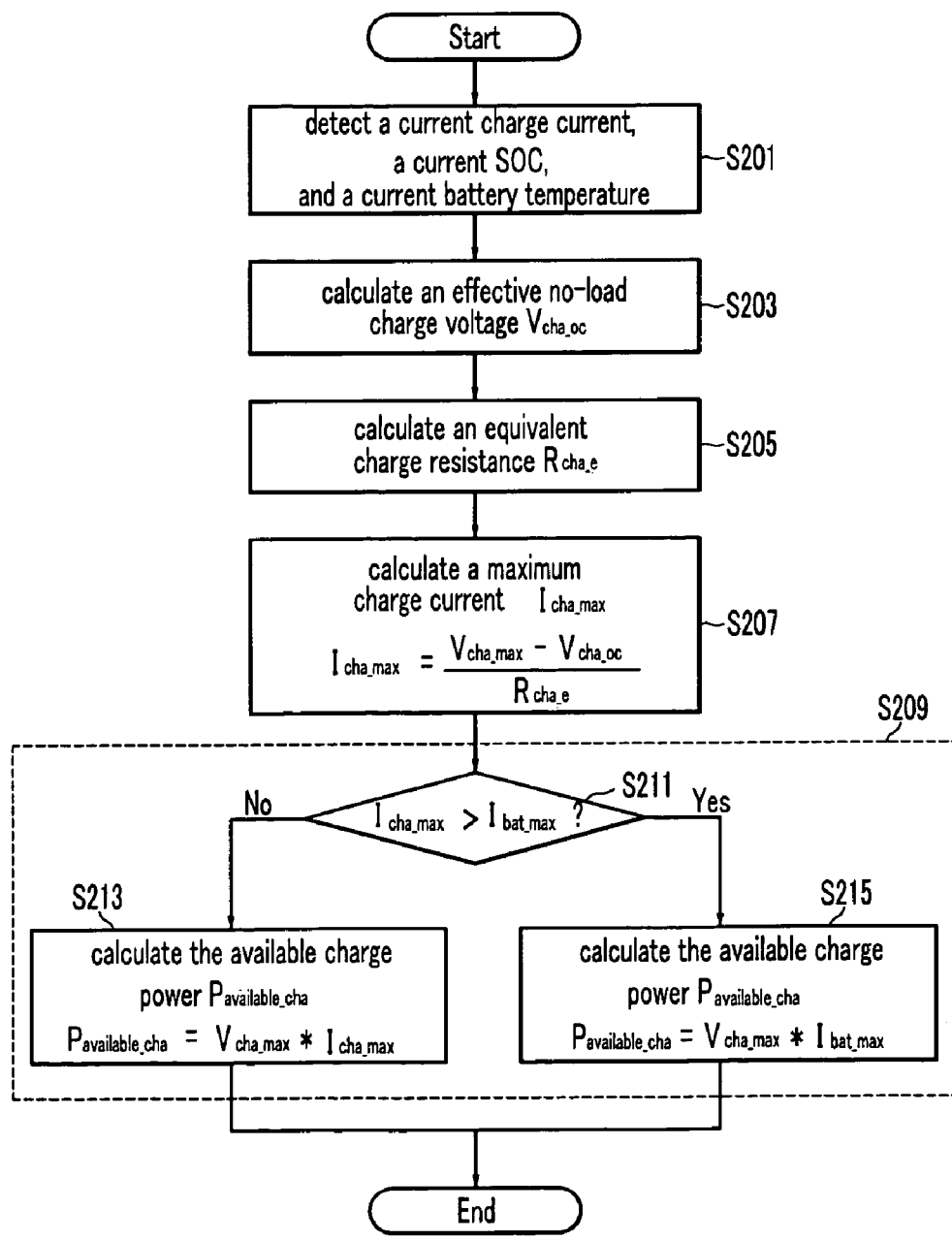
FIG. 2 is a flowchart showing a method for calculating available charge power of a battery according to an embodiment of the present invention.

Referring to FIG. 2, a method for calculating available charge power of a battery according to an embodiment of the present invention will be explained.

At first, in step S201, the battery control unit 11 detects a current charge current $I_{cha}$, a current SOC (State Of Charge), and a current $T_{BAT}$. The charge current and the battery temperature can be respectively detected by the battery current sensor 15 and the battery temperature sensor 13.

In this technical field, various methods for determining the SOC have been introduced. As an example, the SOC can be determined by accumulating an amount of current of the battery 20, that is, the battery SOC can be determined based on the signal of the battery current sensor 15.

Then, in step S203, the battery control unit 11 calculates an effective no-load charge voltage $V_{cha\_oc}$ at the current SOC, the current battery temperature $T_{BAT}$, and the current charge current $I_{cha}$.

In addition, in step S205, the battery control unit 11 calculates an equivalent charge resistance $R_{cha\_e}$ at the current SOC, the current battery temperature $T_{BAT}$, and the current charge current $I_{cha}$.

The effective no-load charge voltage and the equivalent charge resistance can be calculated using predetermined effective no-load charge voltage data and predetermined equivalent charge resistance data.

The predetermined effective no-load charge voltage data include effective no-load charge voltage values respectively at various predetermined charge current ranges, various predetermined SOCs, and various predetermined battery temperatures.

The predetermined equivalent charge resistance data and the predetermined effective no-load charge voltage data can be determined through experiments.

For example, battery terminal voltages are detected at each of the predetermined SOCs at one of the predetermined charge current ranges while a battery is charged by a constant current at a predetermined temperature. Such detection is repeated for each of the predetermined charge current ranges at various battery temperatures.

Then, the equivalent charge resistances $R_{equ}$ are calculated at the predetermined charge current ranges, the predetermined SOCs, and the predetermined battery temperatures, based on the constant currents and the detected terminal voltages. As an example, if the detected terminal voltage is $V_1$ when the battery is charged by the constant current $I_1$ and the detected terminal voltage is $V_2$ when the battery is charged by the constant current $I_2$, the equivalent resistance can be calculated by dividing a difference between the $V_2$ and the $V_1$ by a difference between the $I_2$ and the $I_1$, i.e., $R_{equ}=(V_2-V_1)/(I_2-I_1)$. By performing this calculation for each of the predetermined SOCs respectively at the predetermined charge current ranges and at the predetermined battery temperatures, the equivalent charge resistance data can be determined.

Then, the effective no-load charge voltage $V_{eff}$ can be calculated based on the calculated equivalent charge resistance data, the constant current, and the detected terminal voltage. For example, the effective no-load charge voltage can be calculated by summing the detected terminal voltage $V_1$ and a value acquired by multiplying the constant current $I_1$ by the equivalent charge resistance, i.e., $V_{eff}=V_1+R_{equ}*I_1$, or by summing the detected terminal voltage $V_2$ and a value acquired by multiplying the constant current $I_2$ by the equivalent charge resistance, i.e., $V_{eff}=V_2+R_{equ}*I_2$. By performing this calculation for each of the predetermined SOC, respectively at the predetermined charge current ranges and at the predetermined battery temperatures, the effective no-load charge voltage data can be determined.

Based on the equivalent charge resistance data and the effective no-load charge voltage data, the equivalent charge resistance $R_{cha\_e}$ and the effective no-load charge voltage $V_{cha\_oc}$ can be calculated at the current SOC, the current battery temperature, and the current charge current.

The equivalent charge resistance $R_{cha\_e}$ and the effective no-load charge voltage $V_{cha\_oc}$ at the current SOC, the current battery temperature, and the current charge current can be determined through interpolation using the equivalent charge resistance data and the effective no-load charge voltage data.

Then, in step S207, the battery control unit 11 calculates a maximum charge current $I_{cha\_max}$ by the following equation.

$$I_{cha\_max} = \frac{V_{cha\_max} - V_{cha\_oc}}{R_{cha\_e}} \quad \text{[Equation]}$$

where $V_{cha\_max}$ is a predetermined maximum charge voltage, $V_{cha\_oc}$ is the effective no-load charge voltage, and $R_{cha\_e}$ is the equivalent charge resistance. The predetermined maximum charge voltage $V_{cha\_max}$ is a maximum voltage at which a battery normally operates, and it is inherently determined for each battery.

After calculating the maximum charge current $I_{cha\_max}$ in step S209, the battery control unit 11 calculates available charge power $P_{available\_cha}$ based on the predetermined maximum charge voltage $V_{cha\_max}$, the maximum charge current $I_{cha\_max}$, and a predetermined battery maximum current $I_{bat\_max}$.

The predetermined battery maximum current is a maximum current that can flow from a battery in a normal operation of the battery, and it is inherently determined for each battery.

In step S211, the battery control unit 11 determines whether the calculated maximum charge current is greater than the predetermined battery maximum current.

If it is determined that the maximum charge current is not greater than the predetermined battery maximum current in step S211, the battery control unit 11 calculates the available charge power $P_{available\_cha}$ by the following equation (S213).

$$P_{available\_cha} = V_{cha\_max} * I_{cha\_max} \quad \text{[Equation]}$$

On the other hand, if the determination in step S211 is affirmative, the battery control unit 11 calculates the available charge power $P_{available\_cha}$ by the following equation (S215).

$$P_{available\_cha} = V_{cha\_max} * I_{bat\_max} \quad \text{[Equation]}$$

Figure 3:
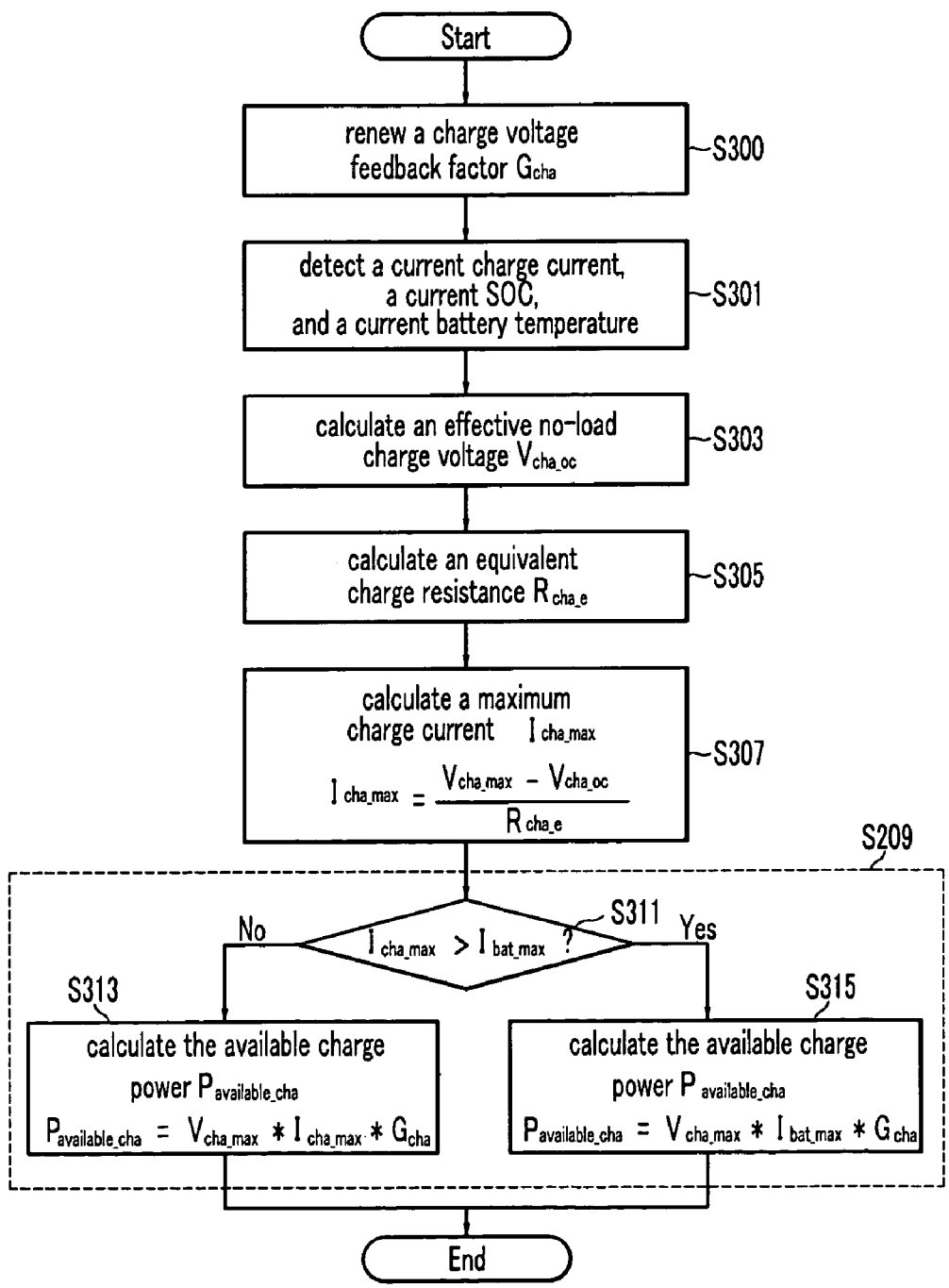
FIG. 3 is a flowchart showing a method for calculating available charge power of a battery according to another embodiment of the present invention.

Hereinafter, referring to FIGS. 3 and 4, a method for calculating available charge power of a battery according to another embodiment of the present invention will be explained.

At first, in step S300, the battery control unit renews a charge voltage feedback factor $G_{cha}$ based on the current battery voltage and the above-stated predetermined maximum charge voltage $V_{cha\_max}$ of the battery 20.

The charge voltage feedback factor is a feedback factor to prevent a battery error that can be caused when the voltage of the battery can be greater than a normal operation voltage, by decreasing available charge power if the current battery voltage is greater than the predetermined maximum charge voltage.

Figure 4:
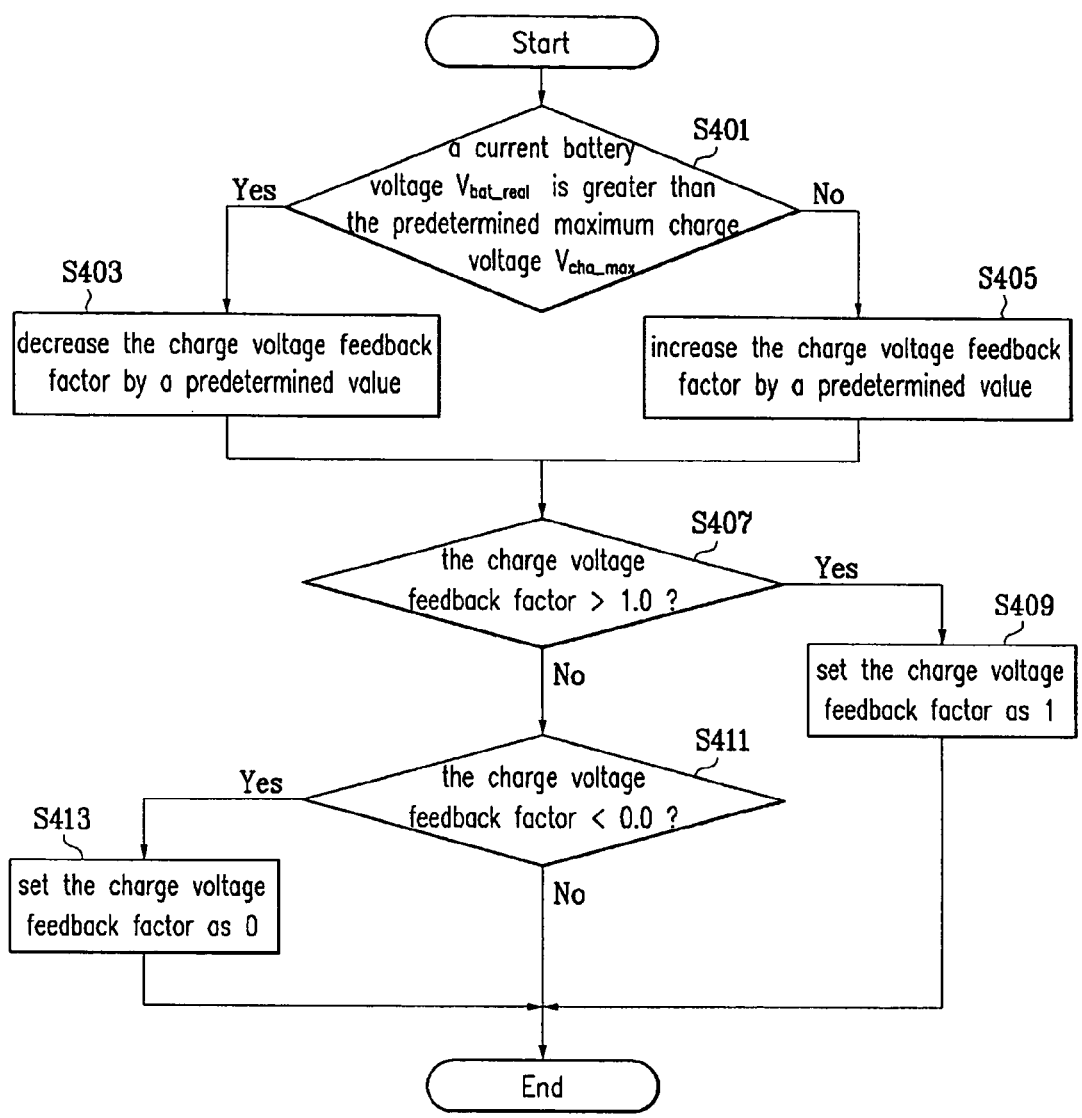
FIG. 4 is a flowchart showing a method for determining a charge voltage feedback factor in the method of FIG. 3.

Referring to FIG. 4, renewing of the charge voltage feedback factor $G_{cha}$ will be explained.

At first, in step S401, the battery control unit 11 determines whether a current battery voltage $V_{bat\_real}$ is greater than the predetermined maximum charge voltage $V_{cha\_max}$.

If the current battery voltage $V_{bat\_real}$ is greater than the predetermined maximum charge voltage $V_{cha\_max}$, the charge voltage feedback factor $G_{cha}$ that was calculated in a previous routine is decreased by a predetermined value in step S403. As an example, the predetermined value can be 0.03.

On the other hand, if the current battery voltage $V_{bat\_real}$ is not greater than the predetermined maximum charge voltage $V_{cha\_max}$, the charge voltage feedback factor $G_{cha}$ that was calculated in the previous routine is increased by a predetermined value in step S405. As an example, the predetermined value can be 0.01.

Then, in step S407, the battery control unit 11 determines whether the changed charge voltage feedback factor $G_{cha}$ is greater than 1.

If the determination in step S407 is affirmative, the charge voltage feedback factor $G_{cha}$ is set as 1 in step S409.

On the other hand, if the determination in step S407 is negative, the battery control unit 11 determines whether the changed charge voltage feedback factor $G_{cha}$ is less than 0 in step S411.

If the determination in step S411 is affirmative, the charge voltage feedback factor $G_{cha}$ is set as 0 in step SS413, and otherwise, the process ends.

Referring again to FIG. 3, in step S301, the battery control unit 11 detects a current charge current $I_{cha}$, a current SOC (State Of Charge), and a current $T_{BAT}$.

Steps S301 to S307 are the same as the steps S201 to S207, so these steps will be explained simply.

In step S303, the battery control unit 11 calculates an effective no-load charge voltage $V_{cha\_oc}$ at the current SOC, the current battery temperature $T_{BAT}$, and the current charge current $I_{cha}$.

In addition, in step S305, the battery control unit 11 calculates an equivalent charge resistance $R_{cha\_e}$ at the current SOC, the current battery temperature $T_{BAT}$, and the current charge current $I_{cha}$.

Then, in step S307, the battery control unit 11 calculates a maximum charge current $I_{cha\_max}$ by the following equation.

$$I_{cha\_max} = \frac{V_{cha\_max} - V_{cha\_oc}}{R_{cha\_e}} \quad \text{[Equation]}$$

where $V_{cha\_max}$ is a predetermined maximum charge voltage, $V_{cha\_oc}$ is the effective no-load charge voltage, and $R_{cha\_e}$ is the equivalent charge resistance.

After calculating the maximum charge current $I_{cha\_max}$, in step S309, the battery control unit 11 calculates available charge power $P_{available\_cha}$ based on the predetermined maximum charge voltage $V_{cha\_max}$, the maximum charge current $I_{cha\_max}$, a predetermined battery maximum current $I_{bat\_max}$, and the charge voltage feedback factor $G_{cha}$.

Firstly, in step S311, the battery control unit 11 determines whether the calculated maximum charge current is greater than the predetermined battery maximum current.

If it is determined that the maximum charge current is not greater than the predetermined battery maximum current in step S311, the battery control unit 11 calculates the available charge power $P_{available\_cha}$ by the following equation (S313).

$$P_{available\_cha} = V_{cha\_max} * I_{cha\_max} * G_{cha} \quad \text{[Equation]}$$

On the other hand, if the determination in step S311 is affirmative, the battery control unit 11 calculates the available charge power $P_{available\_cha}$ by the following equation (S315).

$$P_{available\_cha} = V_{cha\_max} * I_{bat\_max} * G_{cha} \quad \text{[Equation]}$$

Figure 5:
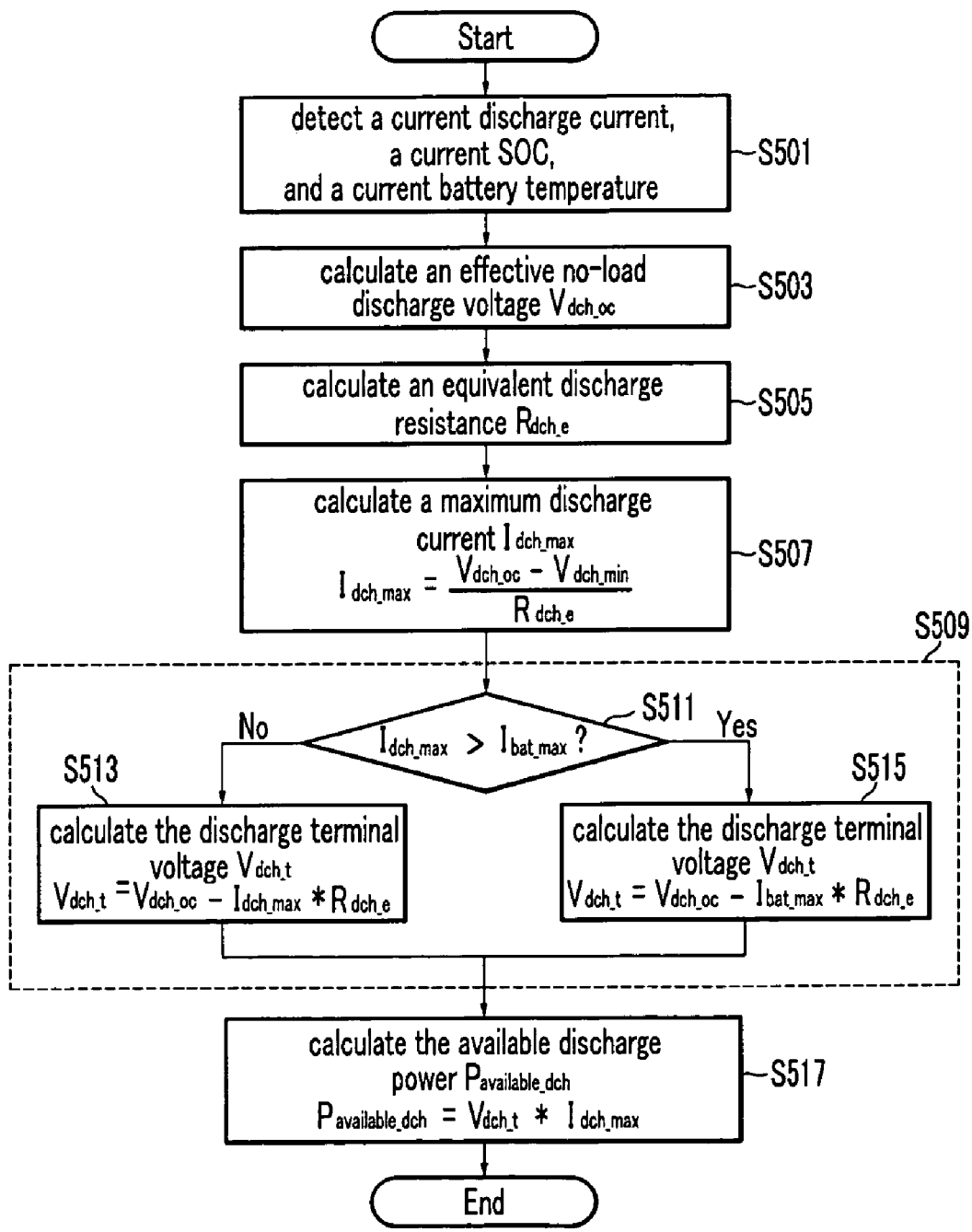
FIG. 5 is a flowchart showing a method for calculating available discharge power of a battery according to an embodiment of the present invention.

Referring to FIG. 5, a method for calculating available discharge power of a battery according to the embodiment of the present invention will be explained.

At first, in step S501, the battery control unit 11 detects a current discharge current $I_{dch}$, a current SOC (State Of Charge), and a current $T_{BAT}$. The discharge current and the battery temperature can be detected by the battery current sensor 15 and the battery temperature sensor 13.

Then, in step S503, the battery control unit 11 calculates an effective no-load discharge voltage $V_{dch\_oc}$ at the current SOC, the current battery temperature $T_{BAT}$, and the current discharge current $I_{dch}$.

In addition, in step S505, the battery control unit 11 calculates an equivalent discharge resistance $R_{dch\_e}$ at the current SOC, the current battery temperature $T_{BAT}$, and the current discharge current $I_{dch}$.

The effective no-load discharge voltage and the equivalent discharge resistance can be determined in a similar way with the effective no-load charge voltage and the equivalent charge resistance. The effective no-load discharge voltage and the equivalent discharge resistance can be calculated using predetermined effective no-load discharge voltage data and predetermined equivalent discharge resistance data. The predetermined effective no-load discharge voltage data include effective no-load discharge voltage values respectively at various predetermined discharge current ranges, various predetermined SOCs, and various predetermined battery temperatures. The predetermined equivalent discharge resistance data and the predetermined effective no-load discharge voltage data can be experimentally determined.

For example, battery terminal voltages are detected at each of the predetermined SOCs at one of the predetermined discharge current ranges while a battery is discharged by a constant current at a predetermined temperature. Such detections are repeated for each of the predetermined discharge current ranges at various battery temperatures.

Then, the equivalent discharge resistances $R_{equ}$ are calculated at the predetermined discharge current ranges, the predetermined SOCs, and the predetermined battery temperatures, based on the constant currents and the detected terminal voltages. As an example, if the detected terminal voltage is $V_1$ when the battery is discharged by the constant current $I_1$ and the detected terminal voltage is $V_2$ when the battery is discharged by the constant current $I_2$, the equivalent resistance can be calculated by dividing a difference between the $V_2$ and the $V_1$ by a difference between the $I_2$ and the $I_1$, i.e., $R_{equ}=(V_2-V_1)/(I_2-I_1)$. By performing this calculation for each of the predetermined SOCs respectively at the predetermined discharge current ranges and at the predetermined battery temperatures, the equivalent discharge resistance data can be determined.

Then, the effective no-load discharge voltage $V_{eff}$ can be calculated based on the calculated equivalent discharge resistance data, the constant current, and the detected terminal voltage. For example, the effective no-load discharge voltage can be calculated by summing the detected terminal voltage $V_1$ and a value acquired by multiplying the constant current $I_1$ by the equivalent discharge resistance, i.e., $V_{eff}=V_1+R_{equ}*I_1$, or by summing the detected terminal voltage $V_2$ and a value acquired by multiplying the constant current $I_2$ by the equivalent discharge resistance, i.e., $V_{eff}=V_2+R_{equ}*I_2$. By performing this calculation for each of the predetermined SOCs respectively at the predetermined discharge current ranges and at the predetermined battery temperatures, the effective no-load discharge voltage data can be determined.

Based on the equivalent discharge resistance data and the effective no-load discharge voltage data, the equivalent discharge resistance $R_{dch\_e}$ and the effective no-load discharge voltage $V_{dch\_oc}$ can be calculated at the current SOC, the current battery temperature, and the current discharge current.

The equivalent discharge resistance $R_{dch\_e}$ and the effective no-load discharge voltage $V_{dch\_oc}$ at the current SOC, the current battery temperature, and the current discharge current can be determined through interpolation using the equivalent discharge resistance data and the effective no-load discharge voltage data.

Then, in step S507, the battery control unit 11 calculates a maximum discharge current $I_{dch\_max}$ by the following equation.

$$I_{dch\_max} = \frac{V_{dch\_oc} - V_{dch\_min}}{R_{dch\_e}} \quad \text{[Equation]}$$

where $V_{dch\_oc}$ is the effective no-load discharge voltage, $V_{dch\_min}$ is a predetermined minimum discharge voltage, and $R_{dch\_e}$ is the equivalent discharge resistance. The predetermined minimum discharge voltage $V_{dch\_min}$ is a minimum voltage at which a battery can be normally discharged, and it is inherently determined for each battery.

After calculating the maximum discharge current $I_{dch\_max}$ in step S509, the battery control unit 11 calculates a discharge terminal voltage $V_{dch\_t}$ based on the effective no-load discharge voltage $V_{dch\_oc}$, the equivalent discharge resistance $R_{dch\_e}$, the maximum discharge current $I_{dch\_max}$, and the predetermined battery maximum current $I_{bat\_max}$. The predetermined battery maximum current is a maximum current that can flow from a battery in a normal operation of the battery, and it is inherently determined for each battery.

Firstly, in step S511, the battery control unit 11 determines whether the calculated maximum discharge current is greater than the predetermined battery maximum current.

If it is determined that the maximum charge current is not greater than the predetermined battery maximum current in step S511, the battery control unit 11 calculates the discharge terminal voltage $V_{dch\_t}$ by the following equation (S513).

$$V_{dch\_t}=V_{dch\_oc}-I_{dch\_max}*R_{dch\_e} \quad \text{[Equation]}$$

On the other hand, if it is determined that the maximum charge current is greater than the predetermined battery maximum current in step S511, the battery control unit 11 calculates the discharge terminal voltage $V_{dch\_t}$ by the following equation (S515).

$$V_{dch\_t}=V_{dch\_oc}-I_{bat\_max}*R_{dch\_e} \quad \text{[Equation]}$$

After calculating the discharge terminal voltage $V_{dch\_t}$, the battery control unit 11 calculates the available discharge power $P_{available\_dch}$ by the following equation (S517).

$$P_{available\_dch}=V_{dch\_t}*I_{dch\_max} \quad \text{[Equation]}$$

Figure 6:
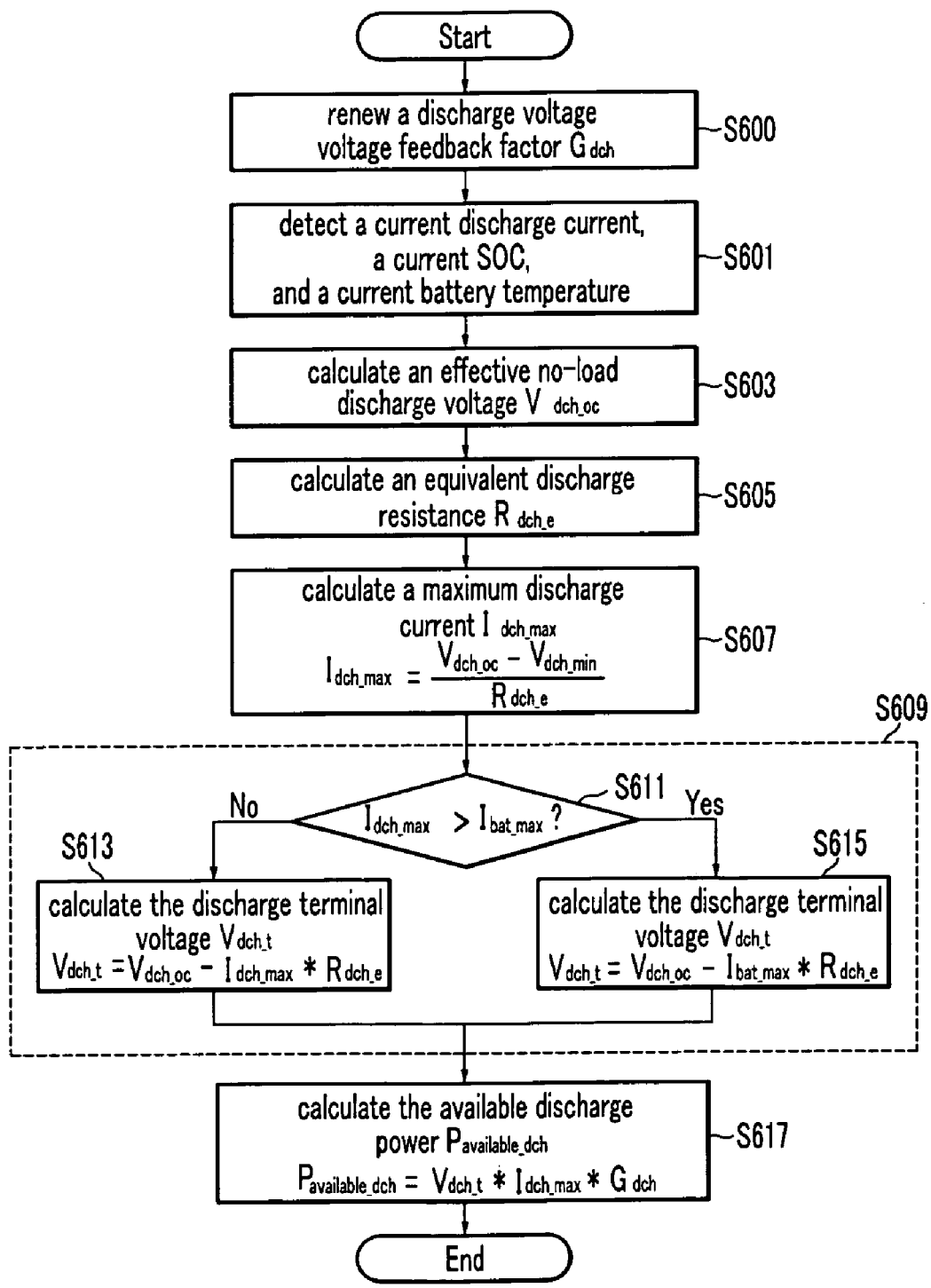
FIG. 6 is a flowchart showing a method for calculating available discharge power of a battery according to another embodiment of the present invention.

Next, referring FIGS. 6 and 7, a method for calculating available discharge power of a battery according to another embodiment of the present invention will be explained.

At first, in step S600, the battery control unit 11 renews a discharge voltage feedback factor $G_{dch}$ based on the current battery voltage and the above stated predetermined minimum discharge voltage $V_{dch\_min}$.

Figure 7:
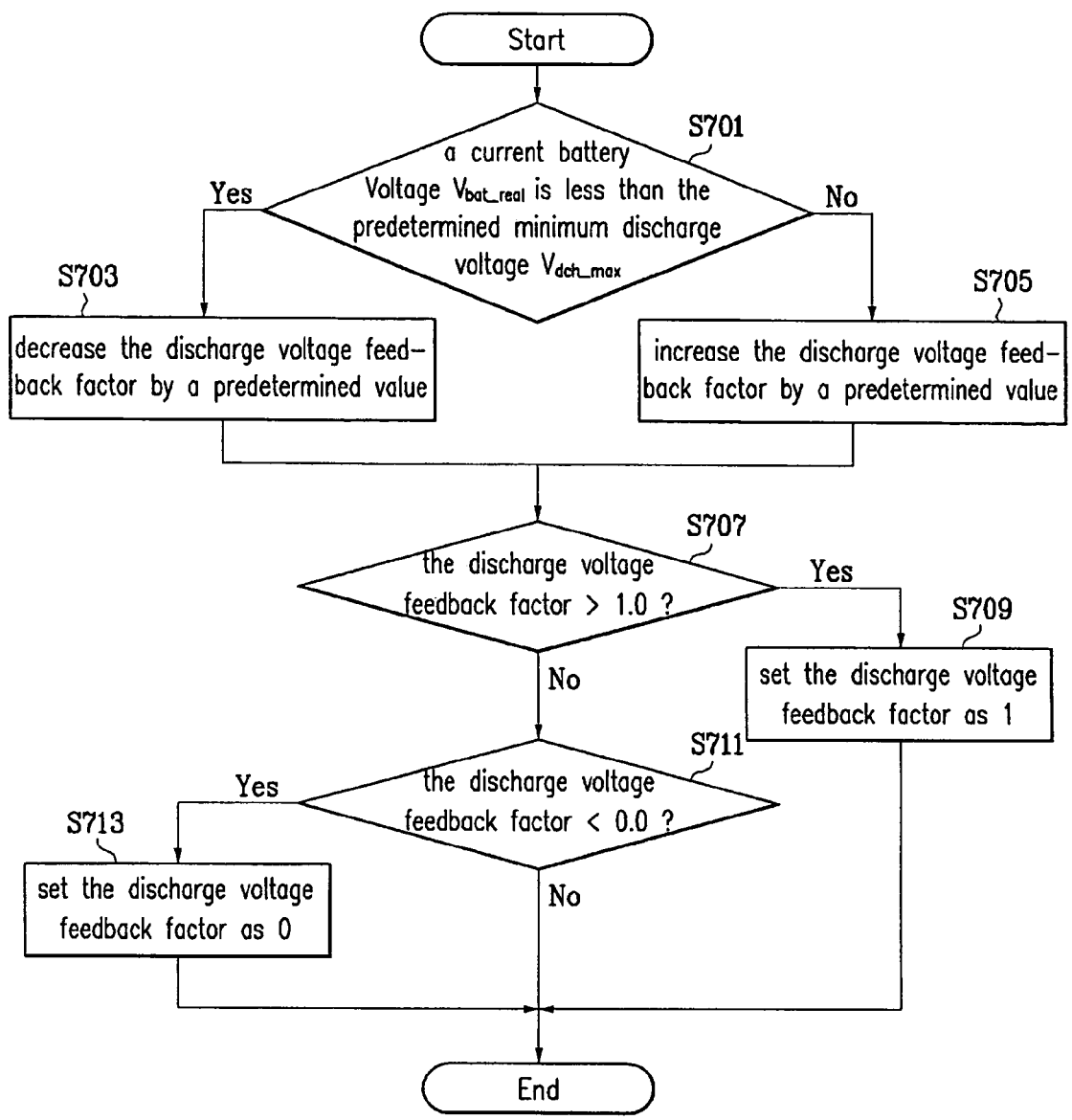
FIG. 7 is a flowchart showing a method for determining a discharge voltage feedback factor in the method of FIG. 6.

Referring to FIG. 7, renewing of the discharge voltage feedback factor $G_{dch}$ will be explained.

At first, in step S701, the battery control unit 11 determines whether a current battery voltage $V_{bat\_real}$ is less than the predetermined minimum discharge voltage $V_{dch\_min}$.

If the current battery voltage $V_{bat\_real}$ is less than the predetermined minimum discharge voltage $V_{dch\_min}$, the discharge voltage feedback factor $G_{dch}$ that was calculated in a previous routine is decreased by a predetermined value in step S703. As an example, the predetermined value can be 0.03.

On the other hand, if the current battery voltage $V_{bat\_real}$ is not less than the predetermined minimum discharge voltage $V_{dch\_min}$, the discharge voltage feedback factor $G_{dch}$ that was calculated in the previous routine is increased by a predetermined value in step S705. As an example, the predetermined value can be 0.01.

Then, in step S707, the battery control unit 11 determines whether the changed discharge voltage feedback factor $G_{dch}$ is greater than 1.

If the determination in step S707 is affirmative, the discharge voltage feedback factor $G_{dch}$ is set as 1 in step S709.

On the other hand, if the determination in step S707 is negative, the battery control unit 11 determines whether the changed discharge voltage feedback factor $G_{dch}$ is less than 0 in step S711.

If the determination in step S711 is affirmative, the discharge voltage feedback factor $G_{dch}$ is set as 0 in step SS713, and otherwise, the process ends.

Referring again to FIG. 6, in step S601, the battery control unit 11 detects a current discharge current $I_{dch}$, a current SOC (State Of Charge), and a current $T_{BAT}$.

Steps S601 to S607 are the same as the steps S501 to S507, so these steps will be explained simply.

In step S603, the battery control unit 11 calculates an effective no-load discharge voltage $V_{dch\_oc}$ at the current SOC, the current battery temperature $T_{BAT}$, and the current discharge current $I_{dch}$.

In addition, in step S605, the battery control unit 11 calculates an equivalent discharge resistance $R_{dch\_e}$ at the current SOC, the current battery temperature $T_{BAT}$, and the current discharge current $I_{dch}$.

Then, in step S607, the battery control unit 11 calculates a maximum discharge current $I_{dch\_max}$ by the following equation.

$$I_{dch\_max} = \frac{V_{dch\_oc} - V_{dch\_min}}{R_{dch\_e}}$$ [Equation]

where $V_{cha\_max}$ is a predetermined maximum discharge voltage, $V_{cha\_oc}$ is the effective no-load discharge voltage, and $R_{cha\_e}$ is the equivalent discharge resistance.

After calculating the maximum discharge current $I_{cha\_max}$, in step S609, the battery control unit 11 calculates a discharge terminal voltage $V_{dch\_t}$ based on the predetermined maximum discharge voltage $V_{cha\_max}$, the maximum discharge current $I_{cha\_max}$, and a predetermined battery maximum current $I_{bat\_max}$.

The predetermined battery maximum current is a maximum current that can flow from a battery in a normal operation of the battery, and it is inherently determined for each battery.

Firstly, in step S611, the battery control unit 11 determines whether the calculated maximum discharge current is greater than the predetermined battery maximum current.

If it is determined that the maximum discharge current is not greater than the predetermined battery maximum current in step S611, the battery control unit 11 calculates the discharge terminal voltage $V_{dch\_t}$ by the following equation (S613).

$$V_{dch\_t} = V_{dch\_oc} - I_{dch\_max} * R_{dch\_e}$$ [Equation]

On the other hand, if the determination in step S611 is affirmative, the battery control unit 11 calculates the discharge terminal voltage $V_{dch\_t}$ by the following equation (S615).

$$V_{dch\_t} = V_{dch\_oc} - I_{bat\_max} * R_{dch\_e}$$ [Equation]

After calculating the discharge terminal voltage $V_{dch\_t}$, the battery control unit 11 calculates the available discharge power $P_{available\_dch}$ by the following equation (S617).

$$P_{available\_dch} = V_{dch\_t} * I_{dch\_max} * G_{dch}$$ [Equation]

The available charge power and the available discharge power that are calculated as stated in the above can be sent to other controllers of a vehicle, and they can be used for a control of the vehicle.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

In the method for calculating available power of a battery according to the embodiment of the present invention, the available power of the battery can be calculated using a charge current, a state of charge, and a battery temperature. Therefore, the available power of the battery can be precisely estimated, so optimal use of the battery can be possible.

Furthermore, because the available discharge power is calibrated by the charge voltage feedback factor and the discharge voltage feedback factor, battery errors according to too high voltage or too low voltage can be prevented.

What is claimed is:

1. A method for determining available power of a battery, comprising:
   determining an equivalent charge resistance at a current charge current, a current SOC (state of charge), and a current battery temperature using predetermined equivalent charge resistance data;
   determining an effective no-load charge voltage at the current charge current, the current SOC, and the current battery temperature using predetermined effective no-load charge voltage data;
   determining a maximum charge current based on the equivalent charge resistance, the effective no-load charge voltage, and a predetermined maximum charge voltage;
   determining an available charge power based on the maximum charge current, the predetermined maximum charge voltage, and a predetermined battery maximum current; and
   communicating the available charge power to a vehicle control unit.

2. The method of claim 1, wherein the maximum charge current is determined by dividing a difference between the predetermined maximum charge voltage and the effective no-load charge voltage by the equivalent charge resistance.

3. The method of claim 1, wherein in determining the available charge power, the available charge power is determined by multiplying the predetermined maximum charge voltage by the predetermined battery maximum current if the maximum charge current is greater than the predetermined battery maximum current, and the available charge power is determined by multiplying the predetermined maximum charge voltage by the maximum charge current if the maximum charge current is not greater than the predetermined battery maximum current.

4. The method of claim 1, further comprising renewing a charge voltage feedback factor based on a current battery voltage and the predetermined maximum charge voltage, and wherein in determining a available charge power, the available charge power is based on the maximum charge current, the predetermined maximum charge voltage, the predetermined battery maximum current, and the charge voltage feedback factor.

5. The method of claim 4, wherein in determining the available charge power, the available charge power is determined through a multiplication of the predetermined maximum charge voltage, the predetermined battery maximum current, and the charge voltage feedback factor if the maximum charge current is greater than the predetermined battery maximum current, and the available charge power is determined through a multiplication of the predetermined maximum charge voltage, the maximum charge current, and the charge voltage feedback factor if the maximum charge current is not greater than the predetermined battery maximum current.

6. The method of claim 4, wherein in renewing the charge voltage feedback factor, the charge voltage feedback factor is decreased by a first predetermined value if the current battery voltage is greater than the predetermined maximum charge voltage, and the charge voltage feedback factor is increased by a second predetermined value if the current battery voltage is not greater than the predetermined maximum charge voltage.

7. The method of claim 6, wherein in renewing the charge voltage feedback factor, the charge voltage feedback factor is set as 1 if the changed charge voltage feedback factor is greater than 1, and the charge voltage feedback factor is set as 0 if the changed charge voltage feedback factor is less than 0.

8. The method of claim 1, wherein the equivalent charge resistance data include a plurality of equivalent charge resistances respectively at predetermined charge current ranges, predetermined SOCs, and predetermined battery temperatures.

9. The method of claim 8, wherein the equivalent charge resistance at the current charge current, the current SOC, and the current battery temperature are determined through interpolation using the equivalent charge resistance data.

10. The method of claim 1, wherein the effective no-load charge voltage data include a plurality of effective no-load charge voltages respectively at predetermined charge current ranges, predetermined SOCs, and predetermined battery temperatures.

11. The method of claim 10, wherein the effective no-load charge voltage at the current charge current, the current SOC, and the current battery temperature are determined through interpolation using the effective no-load charge voltage data.

12. A method for determining available power of a battery, comprising:
    determining an equivalent discharge resistance at a current discharge current, a current SOC (state of charge), and a current battery temperature using predetermined equivalent discharge resistance data;
    determining an effective no-load discharge voltage at the current discharge current, the current SOC, and the current battery temperature using predetermined effective no-load discharge voltage data;
    determining a maximum discharge current based on the equivalent discharge resistance, the effective no-load discharge voltage, and a predetermined minimum discharge voltage;
    determining a discharge terminal voltage based on the maximum discharge current, the effective no-load discharge voltage, the equivalent discharge resistance, and a predetermined battery maximum current;
    determining an available discharge power based on the maximum discharge current and the discharge terminal voltage; and
    communicating the available charge power to a vehicle control unit.

13. The method of claim 12, wherein the maximum discharge current is determined by dividing a difference between the effective no-load discharge voltage and the predetermined minimum discharge voltage by the equivalent discharge resistance.

14. The method of claim 12, wherein in determining the discharge terminal voltage, the discharge terminal voltage is determined as a difference between the effective no-load discharge voltage and a multiplication of the predetermined battery maximum current and the equivalent discharge resistance if the maximum discharge current is greater than the predetermined battery maximum current, and the discharge terminal voltage is determined as a difference between the effective no-load discharge voltage and a multiplication of the maximum discharge current and the equivalent discharge resistance if the maximum discharge current is not greater than the predetermined battery maximum current.

15. The method of claim 14, wherein in determining the available discharge power, the available discharge power is determined through a multiplication of the discharge terminal voltage and the maximum discharge current.

16. The method of claim 12, further comprising renewing a discharge voltage feedback factor based on a current battery voltage and the predetermined minimum discharge voltage, and wherein in determining the available discharge power, the available discharge power is determined based on the maximum discharge current, the discharge terminal voltage, and the discharge voltage feedback factor.

17. The method of claim 16, wherein in determining the discharge terminal voltage, the discharge terminal voltage is determined as a difference between the effective no-load discharge voltage and a multiplication of the predetermined battery maximum current and the equivalent discharge resistance if the maximum discharge current is greater than the predetermined battery maximum current, and the discharge terminal voltage is determined as a difference between the effective no-load discharge voltage and a multiplication of the maximum discharge current and the equivalent discharge resistance if the maximum discharge current is not greater than the predetermined battery maximum current.

18. The method of claim 17, wherein in determining the available discharge power, the available discharge power is determined through a multiplication of the discharge terminal voltage, the maximum discharge current, and the discharge voltage feedback factor.

19. The method of claim 16, wherein in renewing the discharge voltage feedback factor, the discharge voltage feedback factor is decreased by a first predetermined value if the current battery voltage is less than the predetermined minimum discharge voltage, and the discharge voltage feedback factor is increased by a second predetermined value if the current battery voltage is not less than the predetermined minimum discharge voltage.

20. The method of claim 19, wherein in renewing the discharge voltage feedback factor, the discharge voltage feedback factor is set as 1 if the changed discharge voltage feedback factor is greater than 1, and the discharge voltage feedback factor is set as 0 if the changed discharge voltage feedback factor is less than 0.

21. The method of claim 12, wherein the equivalent discharge resistance data include a plurality of equivalent discharge resistances respectively at predetermined discharge current ranges, predetermined SOCs, and predetermined battery temperatures.

22. The method of claim 21, wherein the equivalent discharge resistance at the current discharge current, the current SOC, and the current battery temperature are determined through interpolation using the equivalent discharge resistance data.

23. The method of claim 12, wherein the effective no-load discharge voltage data include a plurality of effective no-load discharge voltages respectively at predetermined discharge current ranges, predetermined SOCs, and predetermined battery temperatures.

24. The method of claim 23, wherein the effective no-load discharge voltage at the current discharge current, the current SOC, and the current battery temperature are determined through interpolation using the effective no-load discharge voltage data.

25. A system for determining available power of a battery, comprising:
  a battery temperature sensor detecting a temperature of the battery and outputting a corresponding signal;
  a battery current sensor detecting a current of the battery and outputting a corresponding signal;
  a battery voltage sensor detecting a voltage of the battery and outputting a corresponding signal; and
  a battery control unit receiving signals from the battery temperature sensor, the battery current sensor, and the battery voltage sensor,
  wherein the battery control unit is programmed to perform control logic comprising:
    determining an equivalent charge resistance at a current charge current, a current SOC (state of charge), and a current battery temperature using predetermined equivalent charge resistance data;
    determining an effective no-load charge voltage at the current charge current, the current SOC, and the current battery temperature using predetermined effective no-load charge voltage data;
    determining a maximum charge current based on the equivalent charge resistance, the effective no-load charge voltage, and a predetermined maximum charge voltage;
    determining an available charge power based on the maximum charge current, the predetermined maximum charge voltage, and a predetermined battery maximum current; and
    communicating the available charge power to a vehicle control unit.

26. The system of claim 25, wherein the maximum charge current is determined by dividing a difference between the predetermined maximum charge voltage and the effective no-load charge voltage by the equivalent charge resistance.

27. The system of claim 25, wherein in determining the available charge power, the available charge power is determined by multiplying the predetermined maximum charge voltage by the predetermined battery maximum current if the maximum charge current is greater than the predetermined battery maximum current, and the available charge power is determined by multiplying the predetermined maximum charge voltage by the maximum charge current if the maximum charge current is not greater than the predetermined battery maximum current.

28. The system of claim 25, wherein the control logic further comprises renewing a charge voltage feedback factor based on a current battery voltage and the predetermined maximum charge voltage, and wherein in determining the available charge power, the available charge power is based on the maximum charge current, the predetermined maximum charge voltage, the predetermined battery maximum current, and the charge voltage feedback factor.

29. The system of claim 28, wherein in determining the available charge power, the available charge power is determined through a multiplication of the predetermined maximum charge voltage, the predetermined battery maximum current, and the charge voltage feedback factor if the maximum charge current is greater than the predetermined battery maximum current, and the available charge power is determined through a multiplication of the predetermined maximum charge voltage, the maximum charge current, and the charge voltage feedback factor if the maximum charge current is not greater than the predetermined battery maximum current.

30. The system of claim 28, wherein in renewing the charge voltage feedback factor, the charge voltage feedback factor is decreased by a first predetermined value if the current battery voltage is greater than the predetermined maximum charge voltage, and the charge voltage feedback factor is increased by a second predetermined value if the current battery voltage is not greater than the predetermined maximum charge voltage.

31. The system of claim 30, wherein in renewing the charge voltage feedback factor, the charge voltage feedback factor is set as 1 if the changed charge voltage feedback factor is greater than 1, and the charge voltage feedback factor is set as 0 if the changed charge voltage feedback factor is less than 0.

32. A system for determining available power of a battery comprising:
  a battery temperature sensor detecting a temperature of the battery and outputting a corresponding signal;
  a battery current sensor detecting a current of the battery and outputting a corresponding signal;
  a battery voltage sensor detecting a voltage of the battery and outputting a corresponding signal; and
  a battery control unit receiving signals from the battery temperature sensor, the battery current sensor, and the battery voltage sensor,
  wherein the battery control unit is programmed to perform control logic comprising:
    determining an equivalent discharge resistance at a current discharge current, a current SOC (state of charge), and a current battery temperature using predetermined equivalent discharge resistance data;
    determining an effective no-load discharge voltage at the current discharge current, the current SOC, and the current battery temperature using predetermined effective no-load discharge voltage data;
    determining a maximum discharge current based on the equivalent discharge resistance, the effective no-load discharge voltage, and a predetermined minimum discharge voltage;

determining a discharge terminal voltage based on the maximum discharge current, the effective no-load discharge voltage, the equivalent discharge resistance, and a predetermined battery maximum current;

determining an available discharge power based on the maximum discharge current and the discharge terminal voltage; and communicating the available charge power to a vehicle control unit.

33. The system of claim 32, wherein the maximum discharge current is determined by dividing a difference between the effective no-load discharge voltage and the predetermined minimum discharge voltage by the equivalent discharge resistance.

34. The system of claim 32, wherein in determining the discharge terminal voltage, the discharge terminal voltage is determined as a difference between the effective no-load discharge voltage and a multiplication of the predetermined battery maximum current and the equivalent discharge resistance if the maximum discharge current is greater than the predetermined battery maximum current, and the discharge terminal voltage is determined as a difference between the effective no-load discharge voltage and a multiplication of the maximum discharge current and the equivalent discharge resistance if the maximum discharge current is not greater than the predetermined battery maximum current.

35. The system of claim 34, wherein in determining the available discharge power, the available discharge power is determined through a multiplication of the discharge terminal voltage and the maximum discharge current.

36. The system of claim 32, wherein the control logic further comprises renewing a discharge voltage feedback factor based on an current battery voltage and the predetermined minimum discharge voltage, and wherein in determining the available discharge power, the available discharge power is determined based on the maximum discharge current, the discharge terminal voltage, and the discharge voltage feedback factor.

37. The system of claim 36, wherein in determining calculating the discharge terminal voltage, the discharge terminal voltage is determined as a difference between the effective no-load discharge voltage and a multiplication of the predetermined battery maximum current and the equivalent discharge resistance if the maximum discharge current is greater than the predetermined battery maximum current, and the discharge terminal voltage is determined as a difference between the effective no-load discharge voltage and a multiplication of the maximum discharge current and the equivalent discharge resistance if the maximum discharge current is not greater than the predetermined battery maximum current.

38. The system of claim 37, wherein in determining the available discharge power, the available discharge power is determined through a multiplication of the discharge terminal voltage, the maximum discharge current, and the discharge voltage feedback factor.

39. The system of claim 36, wherein in renewing the discharge voltage feedback factor, the discharge voltage feedback factor is decreased by a first predetermined value if the current battery voltage is less than the predetermined minimum discharge voltage, and the discharge voltage feedback factor is increased by a second predetermined value if the current battery voltage is not less than the predetermined minimum discharge voltage.

40. The system of claim 39, wherein in renewing the discharge voltage feedback factor, the discharge voltage feedback factor is set as 1 if the changed discharge voltage feedback factor is greater than 1, and the discharge voltage feedback factor is set as 0 if the changed discharge voltage feedback factor is less than 0.

* * * * *